United States Patent
Hsiao et al.

(10) Patent No.: US 10,978,770 B2
(45) Date of Patent: Apr. 13, 2021

(54) FLEXIBLE FLAT CABLE COMPRISING CONDUCTOR LAYERS DISPOSED ON OPPOSITE SIDES OF A METAL ISOLATION LAYER

(71) Applicant: BizLink International Corp., New Taipei (TW)

(72) Inventors: Hsin-Tuan Hsiao, New Taipei (TW); Chih-Feng Cheng, New Taipei (TW)

(73) Assignee: BizLink International Corp., New Taipei (TW)

( * ) Notice: Subject to any disclaimer, the term of this patent is extended or adjusted under 35 U.S.C. 154(b) by 0 days.

(21) Appl. No.: 16/446,638

(22) Filed: Jun. 20, 2019

(65) Prior Publication Data
US 2020/0161733 A1    May 21, 2020

(30) Foreign Application Priority Data
Nov. 21, 2018 (TW) .................... 107141534

(51) Int. Cl.
*H01P 3/08*    (2006.01)
*H01P 3/02*    (2006.01)
(Continued)

(52) U.S. Cl.
CPC ............. *H01P 3/088* (2013.01); *H01B 3/303* (2013.01); *H01B 3/40* (2013.01); *H01B 3/421* (2013.01);
(Continued)

(58) Field of Classification Search
CPC .......... H01P 3/082; H01P 3/088; H01P 3/026; H01P 3/04
(Continued)

(56) References Cited

U.S. PATENT DOCUMENTS

| 7,921,403 B2* | 4/2011 | Dangler et al. ....... H01P 11/003 716/137 |
| 8,058,954 B2* | 11/2011 | Yeates ................... H01P 11/003 333/238 |

(Continued)

FOREIGN PATENT DOCUMENTS

| CN | 101241781 A | 8/2008 |
| CN | 101546622 A | 9/2009 |

(Continued)

*Primary Examiner* — Benny T Lee
(74) *Attorney, Agent, or Firm* — CKC & Partners Co., LLC

(57) ABSTRACT

A high frequency flexible flat cable includes a first metal isolation layer, a first low-k dielectric adhesive layer attached to one side of the first metal isolation layer, a second low-k dielectric adhesive layer attached another side of the first metal isolation layer and at least two conductor layers respectively attached to the first low-k dielectric adhesive layer and the second low-k dielectric adhesive layer. In addition, the high frequency flexible flat cable further includes a third low-k dielectric adhesive layer, a fourth low-k dielectric adhesive layer, a second metal isolation layer and a third metal isolation layer. The second metal isolation layer and the third metal isolation layer are respectively adhered to outsides of the conductor layers by using the third low-k dielectric adhesive layer and the fourth low-k dielectric adhesive layer to adjust the impedance of the high frequency flexible flat cable according to requirements.

10 Claims, 1 Drawing Sheet

(51) Int. Cl.
  *H01B 3/42*    (2006.01)
  *H01B 7/08*    (2006.01)
  *H01B 3/30*    (2006.01)
  *H01B 3/40*    (2006.01)
  *H05K 1/03*    (2006.01)

(52) U.S. Cl.
  CPC .............. *H01B 7/08* (2013.01); *H01P 3/02* (2013.01); *H01P 3/082* (2013.01); *H05K 1/0393* (2013.01)

(58) Field of Classification Search
  USPC ............................................. 333/1, 4, 5, 238
  See application file for complete search history.

(56) References Cited

U.S. PATENT DOCUMENTS

| | | | | |
|---|---|---|---|---|
| 8,735,732 | B2* | 5/2014 | Saji et al. .............. | H05K 1/165 |
| | | | | 174/255 |
| 9,974,160 | B1* | 5/2018 | Sikina et al. ........... | H01P 3/085 |
| 2017/0048968 | A1* | 2/2017 | Komatsu ................. | H01P 3/085 |

FOREIGN PATENT DOCUMENTS

| | | |
|---|---|---|
| CN | 201655379 U | 11/2010 |
| CN | 201773632 U | 3/2011 |
| CN | 201918201 U | 8/2011 |
| CN | 202189580 U | 4/2012 |
| CN | 106233825 A | 12/2016 |
| CN | 107799225 A | 3/2018 |
| TW | 200941818 A | 10/2009 |

\* cited by examiner

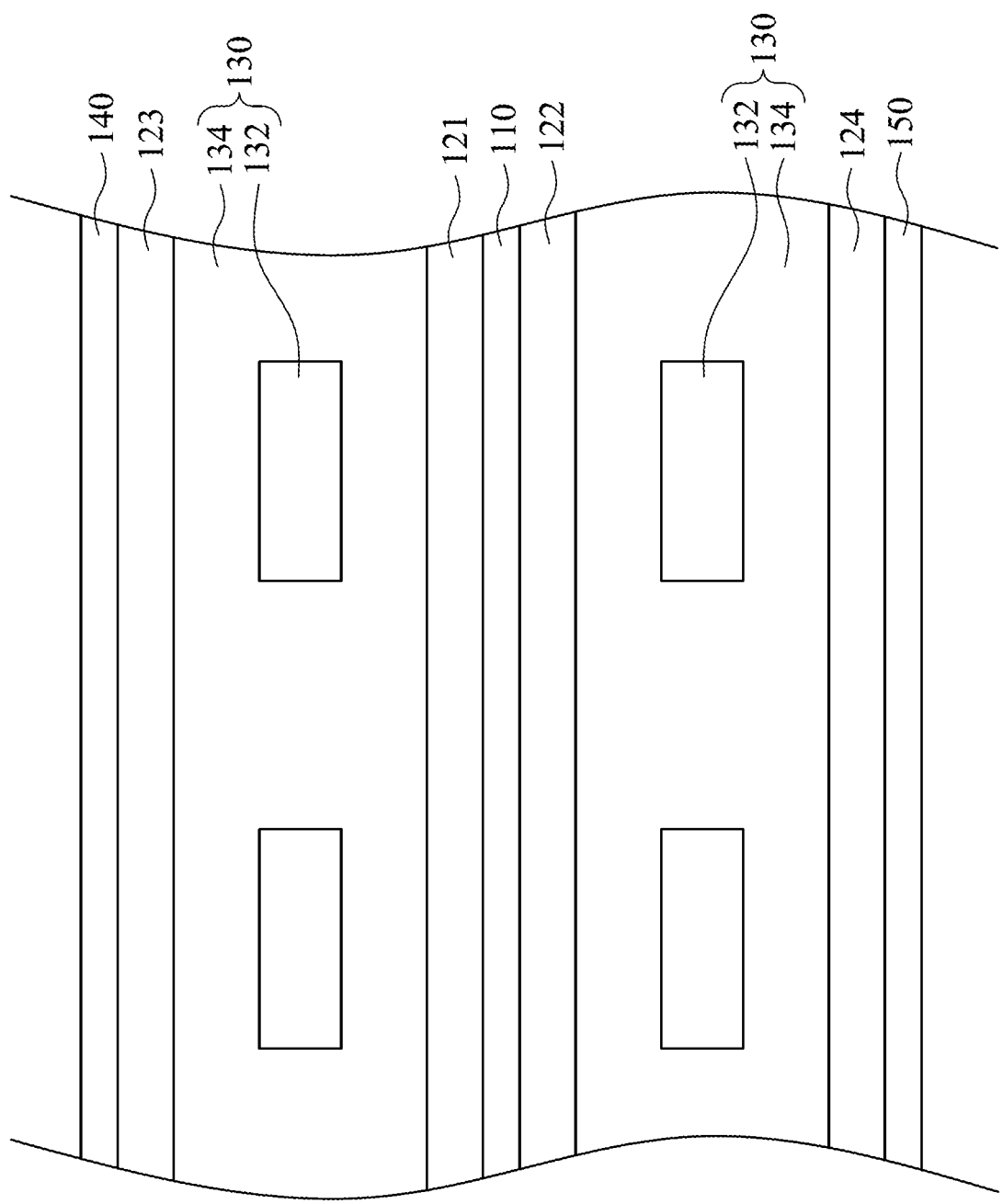

FLEXIBLE FLAT CABLE COMPRISING CONDUCTOR LAYERS DISPOSED ON OPPOSITE SIDES OF A METAL ISOLATION LAYER

RELATED APPLICATIONS

This application claims priority to Taiwan Application Serial Number 107141534, filed Nov. 21, 2018, which is herein incorporated by reference.

TECHNICAL FIELD

The present disclosure generally relates to a flexible flat cable. More particularly, the present disclosure relates to a high frequency flexible flat cable.

BACKGROUND

With the development and innovation of various high frequency electronic products, new high frequency electronic products require relatively more bandwidth. Therefore, the world today relies on the rapid and reliable information transmission.

As semiconductors continue to break through in technology, the semiconductors have been widely used in the computer bus architecture, network infrastructure, and digital wireless communication. In the computer industry, especially when the speed of the server computer processor has been upgraded to gigahertz (GHz), the memory transmission rate and the internal bus speed are also apparently increased. High-speed data transmission technology can support more powerful computer applications such as 3D games and computer-aided design programs. Advanced 3D images require a large amount of data transmission in the CPU, memory, and display card.

However, computer technology is only one part of the new information and bandwidth era. Digital communication engineers are also gradually adopting higher frequency data transmission technology in the new communication products. At the same time, in the field of digital high-definition video technology, the next generation of high-quality, interactive video equipment is being designed. Various new technologies continue to improve data transmission rates. Emerging serial bus is breaking the bottleneck of parallel bus architectures.

The increasing bandwidth is a challenge for digital system design. In the past, data interactions occurred in milliseconds, but now data interactions are measured in nanoseconds. Therefore, there is a need to more accurately transmit the required signals for an electronic cable at a higher data transmission rate.

SUMMARY

One objective of the embodiments of the present invention is to provide a high frequency flexible flat cable to reduce the electromagnetic interference and improve the shielding capacity for shielding the external noise.

To achieve these and other advantages and in accordance with the objective of the embodiments of the present invention, as the embodiment broadly describes herein, the embodiments of the present invention provides a high frequency flexible flat cable including a first metal isolation layer, a first low-k dielectric adhesive layer, a second low-k dielectric adhesive layer, and at least two conductor layers.

The first low-k dielectric adhesive layer is adhered to one side of the first metal isolation layer, the second low-k dielectric adhesive layer is adhered to another side of the first metal isolation layer, and the two conductor layers are respectively adhered to the first low-k dielectric adhesive layer and the second low-k dielectric adhesive layer.

In addition, the high frequency flexible flat cable further includes a third low-k dielectric adhesive layer and a fourth low-k dielectric adhesive layer respectively adhered to the two conductor layers.

In some embodiments, the high frequency flexible flat cable further includes a second metal isolation layer and a third metal isolation layer, and the second metal isolation layer is adhered to an outside of the third low-k dielectric adhesive layer and the third metal isolation layer is adhered to an outside of the fourth low-k dielectric adhesive layer.

In some embodiments, each of the conductor layers includes a plurality of conducting metal wires and an insulation layer surrounding the conducting metal wires.

In some embodiments, a dielectric constant of the first low-k dielectric adhesive layer, a dielectric constant of the second low-k dielectric adhesive layer, a dielectric constant of the third low-k dielectric adhesive layer and a dielectric constant of the fourth low-k dielectric adhesive layer are about 2 to 4.

In some embodiments, a thickness of the first low-k dielectric adhesive layer, a thickness of the second low-k dielectric adhesive layer, a thickness of the third low-k dielectric adhesive layer, and a thickness of the fourth low-k dielectric adhesive layer are about 0.1 mm to 3 mm.

In some embodiments, the insulation layer is an epoxy resin insulation layer, a polyester insulation layer or a polyamine insulation layer.

In some embodiments, a thickness of the first low-k dielectric adhesive layer is different from a thickness of the third low-k dielectric adhesive layer.

In some embodiments, a thickness of the first low-k dielectric adhesive layer, a thickness of the second low-k dielectric adhesive layer, a thickness of the third low-k dielectric adhesive layer and a thickness of the fourth low-k dielectric adhesive layer are different.

In some embodiments, the first low-k dielectric adhesive layer, the second low-k dielectric adhesive layer, the third low-k dielectric adhesive layer and the fourth low-k dielectric adhesive layer have a same thickness.

Hence, the high frequency flexible flat cable can not only adhere the metal isolation layer and the conductor layer by the low-k dielectric adhesive layer, but also utilize the low-k dielectric adhesive layer to adjust the impedance of the flexible flat cable, and reduce the electromagnetic interference by using the metal isolation layer to improve the shielding effect of the electromagnetic interference and effectively shield the external noise so as to effectively increase the quality and speed of the high frequency signal transmission and save the processes for manufacturing the flexible flat cable. Therefore, a high frequency signal transmission for a flexible flat cable with multiple transmission layers can be effectively achieved.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 1 illustrates a schematic diagram showing a high frequency flexible flat cable according to one embodiment of the present invention.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

FIG. 1 illustrates a schematic diagram showing a high frequency flexible flat cable according to one embodiment of the present invention.

As shown in FIG. 1, a high frequency flexible flat cable 100 includes a first metal isolation layer 110, a first low-k dielectric adhesive layer 121 directly adhered to one side of the first metal isolation layer 110, a second low-k dielectric adhesive layer 122 directly adhered to another side of the first metal isolation layer 110 and at least two conductor layers 130 are respectively adhered to the first low-k dielectric adhesive layer 121 and the second low-k dielectric adhesive layer 122.

The high frequency flexible flat cable 100 further includes a third low-k dielectric adhesive layer 123, a fourth low-k dielectric adhesive layer 124, a second metal isolation layer 140 and a third metal isolation layer 150. The third low-k dielectric adhesive layer 123 and the fourth low-k dielectric adhesive layer 124 are respectively adhered to the outsides of the conductor layers 130. The second metal isolation layer 140 is directly adhered to the outside of the third low-k dielectric adhesive layer 123, and the third metal isolation layer 150 is directly adhered to the outside of the fourth low-k dielectric adhesive layer 124.

In some embodiments, the dielectric constant of the first low-k dielectric adhesive layer 121, the dielectric constant of the second low-k dielectric adhesive layer 122, the dielectric constant of the third low-k dielectric adhesive layer 123, and the dielectric constant of the fourth low-k dielectric adhesive layer 124 are about 2 to 4.

In some embodiments, the thickness of the first low-k dielectric adhesive layer 121, the thickness of the second low-k dielectric adhesive layer 122, the thickness of the third low-k dielectric adhesive layer 123, and the thickness of the fourth low-k dielectric adhesive layer 124 are about 0.1 mm to 3 mm.

Hence, the impedance of the high frequency flexible flat cable 100 can be adjusted by controlling the thicknesses and the dielectric constants of the first low-k dielectric adhesive layer 121, the second low-k dielectric adhesive layer 122, the third low-k dielectric adhesive layer 123 and the fourth low-k dielectric adhesive layer 124 so as to improve the signal transmission quality of the high frequency flexible flat cable 100. It is worth noting that the problems of the signal integrity (SI) and signal reflection can be improved to effectively increase the transmission quality of the signal, especially while transmitting the high frequency signals, e.g. 5 GHz (gigahertz) signals or above, by adjusting the impedance of the flexible flat cable.

In some embodiments, the impedance of the high frequency flexible flat cable 100 can be further adjusted by adjusting the thickness of the low-k dielectric adhesive layer. Hence, the thickness of the first low-k dielectric adhesive layer 121 can be different from the thickness of the third low-k dielectric adhesive layer 123 to further control the impedance of the high frequency flexible flat cable 100 as required.

In some embodiments, the thickness of the first low-k dielectric adhesive layer 121, the thickness of the second low-k dielectric adhesive layer 122, the thickness of the third low-k dielectric adhesive layer 123 and, the thickness of the fourth low-k dielectric adhesive layer 124 are different to control the impedance of the high frequency flexible flat cable 100 as required.

In some embodiments, the first low-k dielectric adhesive layer 121, the second low-k dielectric adhesive layer 122, the third low-k dielectric adhesive layer 123 and, the fourth low-k dielectric adhesive layer 124 have the same thickness to control the impedance of the high frequency flexible flat cable 100 as required.

In some embodiments, the conductor layer 130 comprises a plurality of conducting metal wires 132 and an insulation layer 134 surrounding the conducting metal wires 132. In some embodiments, the insulation layer 134 is selected from the group consisting essentially of the epoxy resin, the polyester, the polyamine and the derivatives thereof to form an epoxy resin insulation layer, a polyester insulation layer, a polyamine insulation layer, or the like.

In addition, the first metal isolation layer 110, the second metal isolation layer 140 and the third metal isolation layer 150 can effectively bond the conductor layers 130 together and improve the shielding effect of the electromagnetic interference, and can further shield the external noise so as to enhance the quality of the signal transmission.

Accordingly, the high frequency flexible flat cable can not only adhere to the metal isolation layer and the conductor layer by the low-k dielectric adhesive layer, but also utilize the low-k dielectric adhesive layer to adjust the impedance of the flexible flat cable, and reduce the electromagnetic interference by using the metal isolation layer to improve the shielding effect of the electromagnetic interference and effectively shield the external noise so as to effectively increase the quality and speed of the high-frequency signal transmission and save the processes for manufacturing the flexible flat cable. Therefore, a high frequency signal transmission for a flexible flat cable with multiple transmission layers can be effectively achieved.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A high frequency flexible flat cable, comprising:
   a first metal isolation layer;
   a first low-k dielectric adhesive layer adhered to one side of the first metal isolation layer;
   a second low-k dielectric adhesive layer adhered to another side of the first metal isolation layer; and
   at least two conductor layers respectively adhered to the first low-k dielectric adhesive layer and the second low-k dielectric adhesive layer.

2. The high frequency flexible flat cable of claim 1, further comprising:
   a third low-k dielectric adhesive layer and a fourth low-k dielectric adhesive layer respectively adhered to the two conductor layers.

3. The high frequency flexible flat cable of claim 2, further comprising:
a second metal isolation layer and a third metal isolation layer, wherein the second metal isolation layer is adhered to an outside of the third low-k dielectric adhesive layer and the third metal isolation layer is adhered to an outside of the fourth low-k dielectric adhesive layer.

4. The high frequency flexible flat cable of claim 3, wherein the first low-k dielectric adhesive layer, the second low-k dielectric adhesive layer, the third low-k dielectric adhesive layer and the fourth low-k dielectric adhesive layer have a same thickness.

5. The high frequency flexible flat cable of claim 3, wherein a dielectric constant of the first low-k dielectric adhesive layer, a dielectric constant of the second low-k dielectric adhesive layer, a dielectric constant of the third low-k dielectric adhesive layer and a dielectric constant of the fourth low-k dielectric adhesive layer are about 2 to 4.

6. The high frequency flexible flat cable of claim 5, wherein a thickness of the first low-k dielectric adhesive layer, a thickness of the second low-k dielectric adhesive layer, a thickness of the third low-k dielectric adhesive layer, and a thickness of the fourth low-k dielectric adhesive layer are about 0.1 mm to 3 mm.

7. The high frequency flexible flat cable of claim 3, wherein a thickness of the first low-k dielectric adhesive layer, a thickness of the second low-k dielectric adhesive layer, a thickness of the third low-k dielectric adhesive layer and a thickness of the fourth low-k dielectric adhesive layer are different.

8. The high frequency flexible flat cable of claim 3, wherein a thickness of the first low-k dielectric adhesive layer is different from a thickness of the third low-k dielectric adhesive layer.

9. The high frequency flexible flat cable of claim 1, wherein each of the conductor layers comprises a plurality of conducting metal wires and an insulation layer surrounding the conducting metal wires.

10. The high frequency flexible flat cable of claim 9, wherein the insulation layer is an epoxy resin insulation layer, a polyester insulation layer or a polyamine insulation layer.

* * * * *